United States Patent
Pere-Laperne

(10) Patent No.: US 11,869,905 B2
(45) Date of Patent: Jan. 9, 2024

(54) ELECTROMAGNETIC RADIATION DETECTION DEVICE

(71) Applicant: LYNRED, Palaiseau (FR)

(72) Inventor: Nicolas Pere-Laperne, Grenoble (FR)

(73) Assignee: LYNRED, Palaiseau (FR)

( * ) Notice: Subject to any disclaimer, the term of this patent is extended or adjusted under 35 U.S.C. 154(b) by 553 days.

(21) Appl. No.: 17/258,379

(22) PCT Filed: Jul. 26, 2019

(86) PCT No.: PCT/FR2019/051855
§ 371 (c)(1),
(2) Date: Jan. 6, 2021

(87) PCT Pub. No.: WO2020/021211
PCT Pub. Date: Jan. 30, 2020

(65) Prior Publication Data
US 2021/0296376 A1    Sep. 23, 2021

(30) Foreign Application Priority Data

Jul. 27, 2018 (FR) ..................... 1857039

(51) Int. Cl.
*H01L 27/144* (2006.01)
(52) U.S. Cl.
CPC ...... *H01L 27/1443* (2013.01); *H01L 27/1446* (2013.01)

(58) Field of Classification Search
CPC ....... H01L 27/144–14601; H01L 27/14; H01L 21/02304; H01L 27/14665; H01L 21/02362
See application file for complete search history.

(56) References Cited

U.S. PATENT DOCUMENTS 5,365,088 A * 11/1994 Myrosznyk ......... H01L 27/1465
257/E27.137

FOREIGN PATENT DOCUMENTS

WO  2015/004235 A1  1/2015
WO  2015/115229 A1  8/2015

OTHER PUBLICATIONS

Sep. 25, 2019 Search Report issued in International Patent Application No. PCT/FR2019/051855.

* cited by examiner

*Primary Examiner* — Wasiul Haider
(74) *Attorney, Agent, or Firm* — Oliff PLC

(57) ABSTRACT

A detection device includes an absorbent first stack configured to absorb an electromagnetic radiation in at least a first wavelength range and presenting a first thermal expansion coefficient. It also includes a second stack forming an optical function and presenting a second thermal expansion coefficient. The first thermal expansion coefficient is different from the second thermal expansion coefficient and the detection device further includes a buffer layer separating the first stack and the second stack. The buffer layer presents a thickness included between 0.5 μm and 50 μm so as to absorb the mechanical stresses induced by the first stack.

8 Claims, 3 Drawing Sheets

ELECTROMAGNETIC RADIATION DETECTION DEVICE

BACKGROUND OF THE INVENTION

The invention relates to an electromagnetic radiation detection device.

STATE OF THE ART

To detect one or more electromagnetic signals in a scene, it is commonplace to use a detection device. The detection device comprises a plurality of layers stacked on one another in order to perform the optical and electro-optical functions necessary for detection of the observed signal.

The detection device comprises electrically conducting layers, electrically insulating layers and/or semiconducting layers assembled so as to collect the electromagnetic radiation and to direct the electrical charges formed in the detection device to the output terminals for the electrical signal to be processed.

The detection device further comprises stacks of layers configured to eliminate at least a part of the interference optical signals that are generally optical filters blocking the electromagnetic radiation outside the wavelength range of interest. In addition to the filter functionality, it is commonplace to have one or more lenses that concentrate the electromagnetic radiation in the direction of the areas where transformation of the electromagnetic radiation into an electrical signal is performed.

The stacks used to form the detection devices are complex so that considerable simulation work is performed before fabricating and testing these products.

To detect the electromagnetic radiation, it is common practice to use cooled detection devices, i.e. the association of a detection device with a cooler so that the detection device operates at low temperature. The cooler enables the detection device to be cooled so as to reduce certain noise components.

It is apparent that when practical implementation of the simulated detection device takes place, the performances obtained are not always in accordance with the results of the simulations thereby requiring lengthy and costly complementary development steps.

OBJECT OF THE INVENTION

One object of the invention consists in remedying these shortcomings and in providing a detection device presenting improved performances compared with detection devices of the prior art in particular at low temperature.

It is particularly advantageous to provide a detection device comprising:
- an absorbent first stack configured to absorb an electromagnetic radiation in at least a first wavelength range and presenting a first thermal expansion coefficient and
- a second stack forming an optical function and presenting a second thermal expansion coefficient.

The detection device is remarkable in that the first thermal expansion coefficient is different from the second thermal expansion coefficient and in that it comprises a buffer layer separating the first stack and the second stack, the buffer layer presenting a thickness comprised between 0.5 μm and 50 μm so as to absorb the mechanical stresses induced by the first stack.

In one development, the buffer layer is electrically insulating.

In a particular embodiment, the buffer layer is configured not to absorb the first wavelength range.

It is advantageous to provide a detection device in which:
- the absorbent first stack comprises a first photodetector and a second photodetector adjacent to the first photodetector,
- the second stack comprises a first filter facing the first photodetector, the first filter being configured to let a first wavelength range pass and to block a second wavelength range different from the first wavelength range, the second photodetector being covered by a different optical function from the first filter so as to dissociate the electromagnetic radiation received by the first and second photodetectors.

In an alternative embodiment, the optical function is an anti-reflective layer that also covers the first photodetector.

It is advantageous to provide for the optical function to be a second filter configured to let the second wavelength range pass and to block the first wavelength range.

In another development, the first photodetector and second photodetector are configured to absorb the first wavelength range and the second wavelength range.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
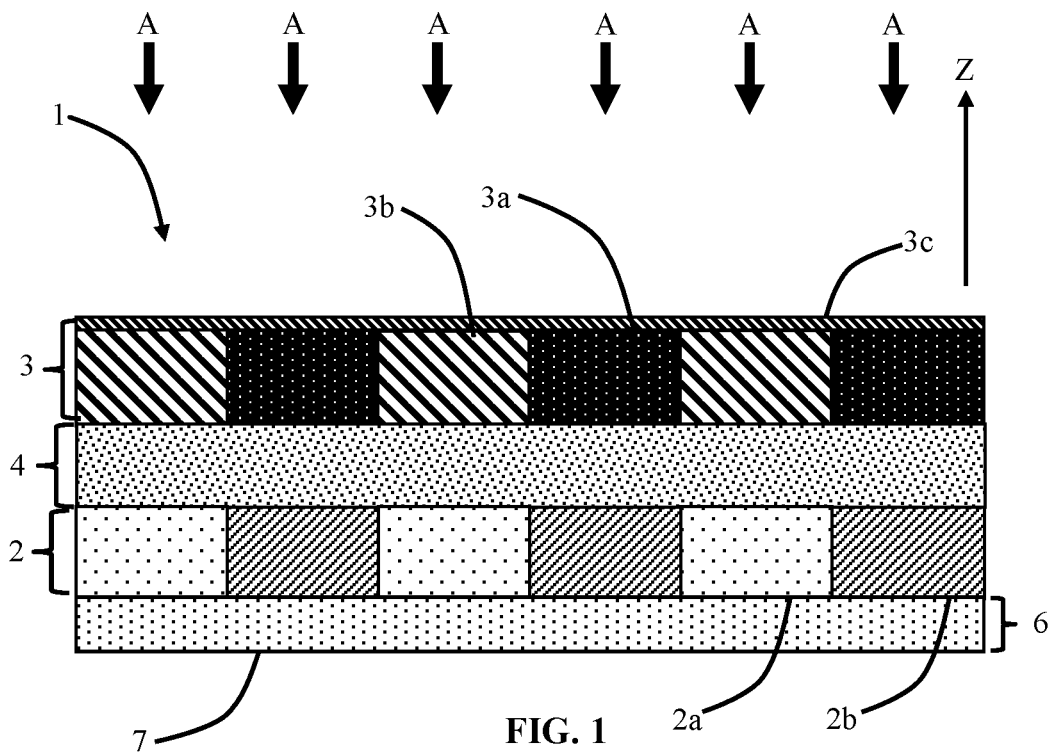
FIG. 1 schematically illustrates an embodiment of a detection device in cross-section, FIGS. 2 to 4 schematically represent production steps of a fabrication method of a detection device in cross-section, FIGS. 5 and 6 schematically represent production steps of another fabrication method of a detection device in cross-section.

As illustrated in FIG. 1, detection device 1 comprises an absorbent first stack 2 that is formed by one or more electrically conducting and semiconducting layers arranged so as to collect an electromagnetic radiation A in at least a first wavelength range and advantageously in at least a first wavelength range and a second wavelength range different from the first wavelength range. The first wavelength range does not have any overlap with the second wavelength range.

First stack 2 advantageously comprises an absorbent layer also called absorbent material that is configured to absorb the incident radiation and to transform the latter into electrical charge carriers forming an electrical signal. The electrical charge carriers resulting from absorption of a light radiation are also called carrier-photons. The absorbent material can be a II-VI material or a III-V material. The absorbent material can be chosen from HgCdTe, InSb, InAsSb, InGaAs and InP. What is meant by III-V material is a semiconductor material composed of one or more elements from the III column (boron, gallium, aluminium, indium, etc.) and from the V column (arsenic, antimony, phosphorus, etc.) of Mendeleyev's periodic table. What is meant by II-VI material is a semiconductor material composed of one or more elements from the II column (zinc, cadmium, mercury, etc.) and from the VI column (sulphur, selenium, tellurium, etc.) of Mendeleyev's periodic table.

A first surface of first stack 2 is at least partially covered, i.e. partially or totally covered, by a second stack 3 forming an optical function. Depending on the embodiment, the optical function can be an anti-reflective, a filter or a lens. It is also possible to provide for second stack 3 to perform more than one function among the functions described above, for example a filter associated with an anti-reflective or a lens associated with an anti-reflective. It is further possible to provide for second stack 3 to perform these three functions. Depending on the configurations, the filter can be a high-pass filter, a low-pass filter or a bandpass filter.

An anti-reflective layer is a layer configured to let at least 99% of the incident light radiation pass over the whole subject wavelength range, for example over the whole wavelength range absorbed by the photodetector or over the whole wavelength range passing through the associated filter.

The anti-reflective function can be performed by a single layer or by several layers preferentially made from electrically insulating material also called dielectric material. When the anti-reflective function is performed by a single layer, it is advantageous to form the anti-reflective function by means of a layer having a thickness d defined by $d=\lambda/4n$, with n the optical index of the anti-reflective layer and 2L the characteristic wavelength of the wavelength range for which the anti-reflective function is required. The characteristic wavelength is advantageously the mean wavelength of the wavelength range, but it is possible to move away from this mean value within the wavelength range of interest. The anti-reflective function is not configured to change the shape of the incident light beam between its input and output.

A lens is an optical function that is configured to let at least 99% of the incident light radiation pass over the whole subject wavelength range and to shape the radiation incident. The shape of the incident radiation is therefore different between the input of the lens and the output of the lens.

A filter is an optical function configured to let one wavelength range pass and to block another wavelength range. For example, the filter is configured to let the first wavelength range pass and to block the second wavelength range. The filter is advantageously configured to let at least 90% of the first wavelength range pass and to block at least 90% of the second wavelength range or vice versa.

Absorbent first stack 2 is separated from second stack 3 forming an optical function by a buffer layer 4. Buffer layer 4 is configured to absorb the thermo-mechanical stresses that exist between first stack 2 and second stack 3.

The inventors observed that absorbent first stack 2 presents a first thermal expansion coefficient that is different from second thermal expansion coefficient present in second stack 3 forming the optical function. When first stack 2 is in direct contact with second stack 3, this difference of thermal expansion coefficient results in a set of stresses arising in absorbent first stack 2 and this set of stresses modifies the electro-optical behaviour of first stack 2. It is therefore advantageous to separate first stack 2 and second stack 3 to reduce or even eliminate the stresses exerted by second stack 3 on first stack 2.

What is meant by thermal expansion coefficient is a mean thermal expansion coefficient over a temperature range extending between a first temperature and a second temperature. The first temperature corresponds for example to the operating temperature of the detection device when the latter captures an electromagnetic signal and transfers the latter in the form of an electronic signal to a processing circuit. The first temperature is for example comprised between 20° C. and 30° C. In advantageous manner, the first temperature is less than 0° C. and preferentially less than 200K and even more advantageously comprised between 80K and 200K. The second temperature can correspond to the deposition temperature of one or more layers forming optical function 3. The deposition temperature can be higher than 50° C. For example, the second temperature is equal to 80° C.

By absorbing the mechanical stresses generated by second stack 3 forming the optical function, buffer layer 4 enables first stack 2 to be close to its scheduled operation, i.e. operation without the mechanical stresses of the optical function or with more homogenous or even identical stresses between the photodetectors formed in the absorbent stack.

Buffer layer 4 can be formed by a single layer or by several different layers, i.e. formed by different materials. It is particularly advantageous to provide for buffer layer 4 to be formed by a single layer as this reduces the optical disturbances between second stack 3 forming the optical function and first stack 2 absorbing the subject radiation. Each time the optical signal encounters an interface, a part of the optical signal is diffracted and is lost.

In advantageous manner, buffer layer 4 is homogeneous. It advantageously presents an identical composition from the surface in contact with absorbent layer 2 up to the surface in contact with second stack 3. This homogeneity of composition is preferentially present in one or more directions parallel to the interface plane between the absorbent layer and the buffer layer and possibly perpendicularly to the interface between buffer layer 4 and absorbent layer 2. What is meant by identical composition is advantageously that the doping is constant from one surface to the other and/or in one or more directions parallel to the interface plane between absorbent layer 2 and buffer layer 4.

Buffer layer 4 is configured so as not to procure any optical function and in particular none of the optical functions listed above. Buffer layer 4 is configured not to absorb the electromagnetic radiation of interest, i.e. the electromagnetic radiation that has to be absorbed by first stack 2. Buffer layer 4 is configured to present an absorption level of the subject radiation of less than 20%, i.e. first stack 2 receives between 100% and 80% of the radiation transmitted by second stack 3. In this way, buffer layer 4 is the most optically neutral for operation of the detection device. Advantageously, buffer layer 4 is configured to present an absorption level of the subject radiation of less than 10% or even 5%.

Buffer layer 4 is configured not to present an electrical function, i.e. it is configured not to let an electrical current pass from first stack 2 to second stack 3. Buffer layer 4 is also configured not to allow an electrical current to pass transversely, i.e. in a direction parallel to the interface between buffer layer 4 and first stack 2.

Buffer layer 4 can be formed by an electrically insulating layer. Buffer layer 4 can be partially or completely formed by a dielectric material, i.e. by an electrically insulating material. It is also possible to provide for buffer layer 4 to be partially or completely formed by a polymer material. Buffer layer 4 can also be partially or completely formed by a non-doped or weakly doped semiconductor material so as to prevent flow of an electrical current. If a semiconductor material is used, it does not absorb the desired electromagnetic radiation.

In certain embodiments, buffer layer 4 can be formed by a layer that presents a doping by electrically active dopants of more than $1*10^{16}$ cm$^{-3}$. However, buffer layer 4 is not configured to perform a carrier-photon generation and collection function in the spectral range of interest. This doping can be an involuntary doping, i.e. the layer is unintentionally doped.

In an advantageous embodiment, buffer layer 4 is made from an amorphous material. In another embodiment, buffer layer 4 presents a lattice match with absorbent material 2 so as not to induce or to limit generation of a stress linked to a lattice mismatch with absorbent material 2.

Buffer layer 4 represents a total thickness that is comprised between 0.5 µm and 50 µm. This thickness range is particularly advantageous as it enables the technological constraints of a second stack 3 comprising for example a plurality of lenses and/or a plurality of filters to be accommodated. The lenses enable a large quantity of the observed optical signal to be made to converge towards a photodetector of smaller cross-section.

The thickness of buffer layer 4 is smaller than a threshold beyond which the optical cavity that exists between first stack 2 and second stack 3 is subjected to problems of crosstalk between two adjacent pixels i.e. between two immediately adjacent photodetectors. The inventors observed that above a thickness of 50 µm, it is very difficult to achieve an optical cavity that does not present crosstalk problems.

For example, for a detection device comprising a plurality of pixels arranged with a repetition pitch equal to 15 µm, geometric optical simulations show that incorporation of a buffer layer 4 of more than 50 µm exacerbates the optical crosstalk greatly reducing the performances of the device. For instance, in this example the use of a buffer layer 4 having a thickness less than or equal to 40 µm enables a detection device with acceptable crosstalk performances to be maintained.

For example, for a detection device whose pixels are arranged with a repetition pitch equal to 15 µm, it is advantageous to use a buffer layer 4 having a thickness that is less than or equal to 26 µm to achieve almost optimal performances.

In advantageous manner, to limit crosstalk, when the detection device presents a plurality of photodetectors in absorbent layer 2 with a repetition pitch P, it is advantageous to use a buffer layer 4 having a thickness d that is less than P/(2*tan(½n)) with n the optical index of buffer layer 4, i.e.

$$d \leq \frac{P}{2 * \tan\left(\frac{1}{2n}\right)}.$$

The inventors observed that integration of a heterogeneous optical function also requires the absorbent stack to be shifted beyond a minimum value. A heterogeneous optical function can be formed by a plurality of lenses and/or a plurality of filters in second stack 3, i.e. by the presence of at least two different stacks 3a and 3b in a direction perpendicular to the interface between buffer layer 4 and second stack 3. The two different stacks 3a and 3b are adjacent in a direction parallel to the interface between first stack 2 and buffer layer 4.

As the two stacks are different, they can induce different mechanical stresses in absorbent layer 2.

In an advantageous embodiment, buffer layer 4 is formed by a semi-conductor material presenting a lattice match with first stack 2 or substantially presenting a substantially lattice match with first stack 2. What is meant by presenting a lattice match is that the lattice parameter difference is less than 1% between buffer layer 4 and first stack 2.

Figure 2:
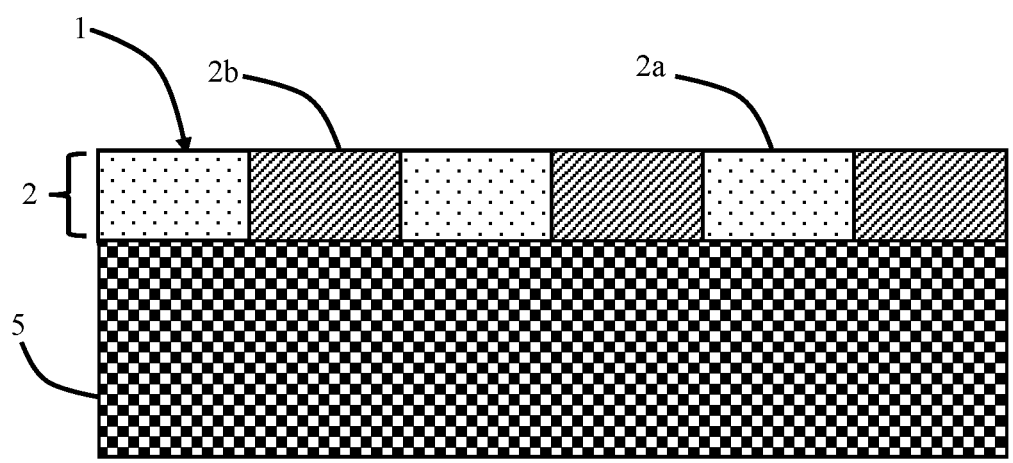
Figure 3:
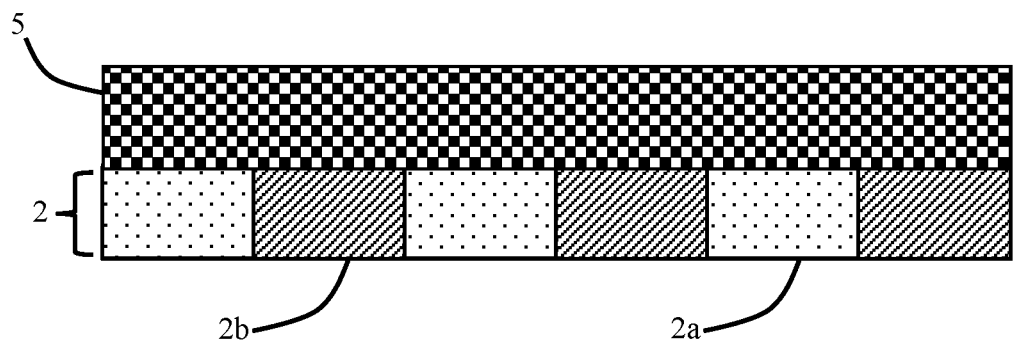
Figure 4:
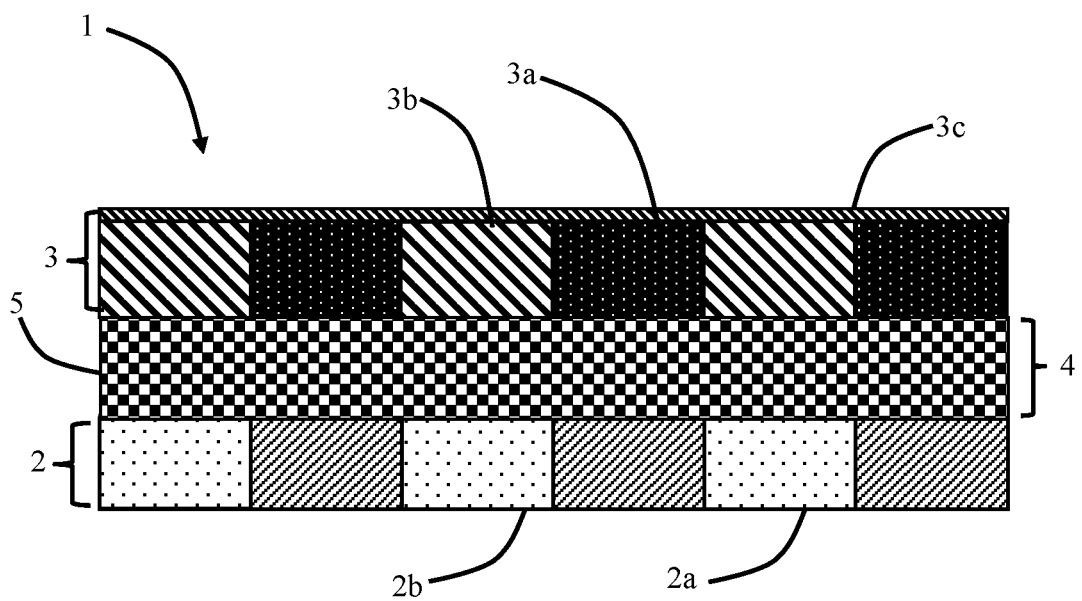

In a particular embodiment illustrated in FIGS. 2, 3 and 4, first stack 2 is made on a first surface of initial substrate 5, for example first stack 2 is produced by epitaxy (FIG. 2). The different layers of first stack 2 are formed on first surface 5a. Then second surface 5b opposite first surface 5a is covered by second stack 3. Substrate 5 is at least partially kept in order to absorb stresses. Very often, a thinning step of initial substrate 5 is performed before depositing second stack 3 as the thickness of the substrate is very large and gives rise to optical disturbances in the detection device. Thinning of substrate 5 is illustrated in FIG. 3 before the formation step of second stack 3 (FIG. 4).

Figure 5:
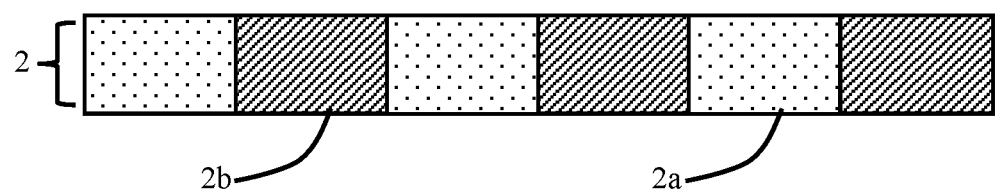
Figure 6:
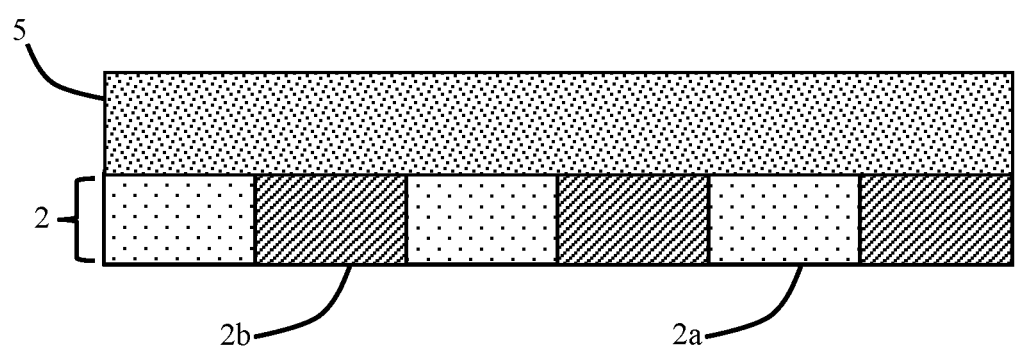

In another particular embodiment illustrated by FIGS. 2, 5 and 6, first stack 2 is made on a first surface 5a of an initial substrate 5 for example by epitaxy (FIG. 2). The different layers of first stack 2 are formed on first surface 5a and initial substrate 5 is then eliminated as illustrated in FIG. 5. Buffer layer 4 is deposited on first stack 2, on the surface initially in contact with substrate which was eliminated (FIG. 6) before formation of second stack 3.

Second stack 3 is then deposited on buffer layer 4 so that first stack 2 and second stack 3 are separated by buffer layer 4. FIG. 5 is schematic as the photodetectors are very often associated with a support substrate, for example readout circuits 7 or an intermediate support in order to ensure the mechanical strength of photodetectors 2a/2b when formation of the optical function is performed. Readout circuit 7 is configured to perform collection of the carrier-photons directed to a signal processing integrated circuit.

In a particular embodiment, the detection device is a multispectral detection device in which first stack 2 comprises at least a first photodetector 2a sensitive to a first wavelength range also called first spectral waveband and a second photodetector 2b sensitive to a second wavelength range also called second spectral waveband.

In a particular embodiment, first photodetector 2a and second photodetector 2b comprise a single semiconductor film that is configured to absorb the first wavelength range and the second wavelength range. This embodiment is particularly advantageous as it is very compact and enables the two photodetectors to be fabricated at the same time.

In an advantageous embodiment, the detection device comprises a plurality of first photodetectors 2a and second photodetectors 2b. The plurality of first photodetectors 2a and the plurality of second photodetectors 2b form a focal plane array, i.e. all the photodetectors are arranged in the same plane.

In preferential manner, first stack 2 comprises as many first photodetectors 2a as second photodetectors 2b. As an alternative, it is also possible to provide for first stack 2 to comprise a number of first photodetectors 2a that is different from the number of second photodetectors 2b.

In a particular embodiment, the second wavelength range is different from the first wavelength range. In advantageous manner, the second wavelength range is dissociated from the first wavelength range, i.e. the wavelength ranges do not overlap. Depending on the embodiments, the first and second wavelength ranges have a common boundary or they are separated by a wavelength range.

First photodetector 2a and second photodetector 2b are both sensitive to the first wavelength range and to the second wavelength range. In other words, first photodetector 2a and second photodetector 2b are able to collect the radiation emitted in the first wavelength range and to provide an electrical signal representative of this radiation. First photodetector 2a and second photodetector 2b are also able to collect the radiation emitted in the second wavelength range and to provide an electrical signal representative of this radiation.

In advantageous manner, the first and second wavelength ranges are infrared radiation ranges. In a particular embodiment, the first wavelength range and second wavelength range are chosen from the following ranges:

MWIR: between 3 μm and 8 μm,
LWIR: between 8 μm and 15 μm,
SWIR: between 1.4 μm and 3 μm.

It is therefore possible to configure the detection device so that the latter can detect different pairs of wavelength ranges, for example MWIR/LWIR, MWIR/SWIR or LWIR/SWIR.

It is further possible to break down the different ranges presented above into two different sub-ranges. In a particular embodiment, the first and second wavelength ranges divide for example the MWIR radiation into two distinct sub-ranges. The same can be the case for the LWIR and SWIR.

The supply conditions of photodetectors 2a and 2b can be different. Advantageously, the supply conditions are identical for all the photo-detectors. The supply conditions are provided by a first readout circuit for first photodetector 2a and by a second readout circuit for second photodetector 2b.

Photodetectors 2a and 2b and readout circuits 7a and 7b are advantageously arranged on a support 6. Support 6 presents a third thermal expansion coefficient that can be different from the first thermal expansion coefficient and from the second thermal expansion coefficient. Buffer layer 4 is then adapted so that the assembly formed by support 6 and absorbent first stack 2 is less disturbed or not disturbed by second stack 3 forming an optical function.

Advantageously, in order to specialise first and second photodetectors 2a and 2b, second stack 3 is configured to form a filtering system of the incident radiation.

In a first configuration, second stack 3 is configured to block a part of the incident radiation on the input of first photodetector 2a and not to block the incident radiation on the input of second photodetector 2b.

For example, second stack 3 comprises a first filter 3a that is configured to let the first wavelength range pass and to block the second wavelength range. First filter 3a can be an interference filter or an absorption filter.

Depending on the embodiments, the first wavelength range can present longer or shorter wavelengths than the second wavelength range. First filter 3a can therefore be a low-pass filter or a high-pass filter whose cut-off wavelength is located between the first wavelength range and the second wavelength range. As an alternative, it is also possible to provide for first filter 3a to be a bandpass filter that lets the first wavelength range pass and blocks the second wavelength range.

First filter 3a is a filter that is deposited directly on buffer layer 4, i.e. on a part of the focal plane array. First filter 3a is not formed over second photodetector 2b so that first filter 3a covers first photodetector 2a and leaves second photodetector 2b uncovered. First filter 3a is in mechanical contact with first photodetector 2a via buffer layer 4.

By means of this particular configuration, first photodetector 2a only receives a part of the incident radiation. First photodetector 2a receives the first wavelength range and does not receive the second wavelength range. Second photodetector 2b on the other hand receives the first wavelength range and the second wavelength range as it is not associated with first filter 3a.

First photodetector 2a emits an electrical signal that is representative of the received radiation. The electrical signal originating from first photodetector 2a is representative of the radiation in the first wavelength range.

In advantageous manner, first photodetector 2a is connected to a readout circuit 7 that stores the signal emitted by the associated photodetector. Readout circuit 7 transmits another first electrical signal which is advantageously a voltage signal to a processing circuit (not shown). Second photodetector 2b is also connected to the processing circuit which receives a second electrical signal.

In a particular embodiment, an anti-reflective layer 3c is formed in second stack 3. In one embodiment, anti-reflective layer 3c is arranged between first filter 3a and buffer layer 4. As an alternative, anti-reflective layer 3c is arranged above first filter 3a so that first filter 3a separates anti-reflective layer 3c and first stack 2.

It is particularly advantageous to provide for second photodetector 2b to be covered by a different optical function from first filter 3a. This optical function is advantageously chosen from the optical functions presented in the foregoing, for example another filter.

In preferential manner, the additional optical function arranged above second photodetector 2b is constituted by or comprises an anti-reflective layer. In this configuration, second stack 3 is heterogeneous with different stacks of layers above first photodetector 2a and second photodetector 2b. As the stacks are different, the thermal expansion coefficients are also different and/or the residual stresses that exist in these two stacks are different. A set of stresses that varies spatially from one optical function to the other is then introduced. The absence of buffer layer 4 results in different responses from first and second photodetectors 2a and 2b. When the detection device is fabricated, first stack 2 is more sensitive to the alignment of second stack 3. By introducing buffer layer 4, it is possible to form detection devices that are more repeatable and more compliant with the expected operation.

In another embodiment, second stack 3 comprises two adjacent optical functions that are different, for example a first filter 3a and a second filter 3b presenting different optical properties. Second filter 3b is adjacent to first filter 3a in a direction parallel to the interface between first stack 2 and buffer layer 4. Second filter 3b is configured to let the second wavelength range pass and to block the first wavelength range. Second filter 3b can be an interference filter or an absorption filter.

To functionalise the pixels, filters 3a and 3b are different resulting in stresses arising between the photodetectors. In so far as the stresses applied on the detectors are different, this can lead to differences in ageing of the photodetector compared with the adjacent photodetector. This can also lead to a difference of electrical response. The stresses can also generate crystallographic defects which impair operation of the detection device.

Simulations have shown that the stress difference arising from differentiation of the optical functions above the photodetectors induces a heterogeneous set of stresses that becomes homogenous at a depth of about 400 nm starting from the interface on which the optical response differentiation filters are formed.

It is therefore particularly advantageous to use a buffer layer 4 having a thickness at least equal to 500 nm so that all the photodetectors are subjected to the same set of stresses and in more general manner so that the absorbent material is subjected to a homogeneous stress.

In particularly advantageous manner, a buffer layer 4 having a thickness at least equal to 2 μm enables the stress introduced by the optical function in absorbent layer 2 to be greatly reduced or even eliminated. In this way, operation of the photodetectors is closer or even identical to what is expected when the simulations or tests without an optical function are performed.

In advantageous manner, the detection device is a cooled detection device, i.e. a device that is configured to operate at a temperature of less than 200K. For example, the detection device is configured to present an operating temperature comprised between 80K and 200K. The detection device is advantageously coupled with a cooling system 7 enabling it to be cooled to its operating temperature. Under these conditions, the temperature difference that exists between the temperature at which second stack 3 is formed and the operating temperature is very large which may lead to high stresses.

The invention claimed is:

1. Detection device comprising:
   an absorbent first stack configured to absorb an electromagnetic radiation in at least a first wavelength range and presenting a first thermal expansion coefficient, the absorbent first stack comprising a layer made from absorbent material, the absorbent material being a II-VI material or a III-V material,
   a second stack forming an optical function and presenting a second thermal expansion coefficient, the first thermal expansion coefficient being different from the second thermal expansion coefficient, and
   a buffer layer separating the absorbent first stack and second stack so as to separate the absorbent first stack from a set of mechanical stresses introduced by the second stack, the buffer layer presenting a thickness comprised between 0.5 µm and 50 µm,
   wherein the buffer layer is formed by a semiconductor material that is lattice matched with the first stack or wherein the difference of lattice parameter between the buffer layer and absorbent first stack is less than 1%.

2. Detection device according to claim 1, wherein the buffer layer is electrically insulating.

3. Detection device according to claim 1, wherein the buffer layer is configured not to absorb the first wavelength range.

4. Detection device according to claim 1, wherein:
   the absorbent first stack comprises a first photodetector and a second photodetector adjacent to the first photodetector,
   the second stack comprises a first filter facing the first photodetector, the first filter being configured to let the first wavelength range pass and to block a second wavelength range different from the first wavelength range, the second photodetector being covered by an optical function different from the first filter so as to dissociate the electromagnetic radiation received by the first and second photodetectors.

5. Detection device according to claim 4, wherein the optical function is an anti-reflective layer that also covers the first photodetector.

6. Detection device according to claim 4, wherein the optical function is a second filter facing the second photodetector and configured to let the second wavelength range pass and to block the first wavelength range.

7. Detection device according to claim 4, wherein the first and second photodetectors are configured to absorb the first wavelength range and the second wavelength range.

8. Detection device according to claim 1, wherein the absorbent first stack comprises a plurality of photodetectors arranged with a repetition pitch P and wherein the buffer layer presents a thickness d such that $$d \leq \frac{P}{2 * \tan\left(\frac{1}{2n}\right)}$$

with n being an optical index of the buffer layer.

* * * * *